US012575152B2

(12) United States Patent
Miyase et al.

(10) Patent No.: US 12,575,152 B2
(45) Date of Patent: Mar. 10, 2026

(54) SILICON CARBIDE EPITAXIAL SUBSTRATE AND SILICON CARBIDE SEMICONDUCTOR DEVICE

(71) Applicant: SUMITOMO ELECTRIC INDUSTRIES, LTD., Osaka (JP)

(72) Inventors: Takaya Miyase, Osaka (JP); Hideyuki Hisanabe, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 458 days.

(21) Appl. No.: 18/271,447

(22) PCT Filed: Jan. 6, 2022

(86) PCT No.: PCT/JP2022/000248
§ 371 (c)(1),
(2) Date: Jul. 8, 2023

(87) PCT Pub. No.: WO2022/153918
PCT Pub. Date: Jul. 21, 2022

(65) Prior Publication Data
US 2024/0304676 A1    Sep. 12, 2024

(30) Foreign Application Priority Data

Jan. 15, 2021    (JP) ................................ 2021-004753

(51) Int. Cl.
*H10D 62/53*        (2025.01)
*C30B 25/18*        (2006.01)
(Continued)

(52) U.S. Cl.
CPC .......... *H10D 62/53* (2025.01); *C30B 25/183* (2013.01); *C30B 25/20* (2013.01); *C30B 29/36* (2013.01);
(Continued)

(58) Field of Classification Search
CPC .. H10D 62/53; H10D 62/8325; C30B 25/183; C30B 25/20; H01L 21/02378; H01L 21/02529
See application file for complete search history.

(56) References Cited

U.S. PATENT DOCUMENTS

2018/0363166 A1    12/2018  Wada et al.
2019/0040545 A1*   2/2019   Nakamura ........ H01L 21/02529
(Continued)

FOREIGN PATENT DOCUMENTS

JP        2007-506289  A      3/2007
JP        2013-121898  A      6/2013
(Continued)

OTHER PUBLICATIONS

Li, Y. et al. Reduction of morphological defects in 4H-SiC epitaxial layers. Journal of Crystal Growth. 2019, vol. 506, pp. 108-113.

*Primary Examiner* — William B Partridge
*Assistant Examiner* — Alexandre X Ramirez
(74) *Attorney, Agent, or Firm* — Renner, Otto, Boisselle & Sklar, LLP

(57)        ABSTRACT

A silicon carbide epitaxial layer includes a buffer layer in contact with the silicon carbide substrate, a transition layer disposed on the buffer layer, and a drift layer disposed on the transition layer. An area density of the first defect is a first area density, and an area density of the second defect is a second area density, the first area density is 0.03/cm² or more, and a value obtained by dividing the second area density by a sum of the first area density and the second area density is less than 2.91%. The first defect, as viewed perpendicularly to the main surface, is shaped to bifurcate from a first origin. No recessed groove is present on an imaginary line segment connecting both ends of the first defect.

10 Claims, 14 Drawing Sheets

(51) Int. Cl.

| | | |
|---|---|---|
| *C30B 25/20* | (2006.01) | |
| *C30B 29/36* | (2006.01) | |
| *H01L 21/02* | (2006.01) | |
| *H10D 62/832* | (2025.01) | |

(52) U.S. Cl.
CPC .. *H01L 21/02378* (2013.01); *H01L 21/02529* (2013.01); *H10D 62/8325* (2025.01)

(56)                    References Cited

U.S. PATENT DOCUMENTS

| | | | |
|---|---|---|---|
| 2020/0013858 A1 | 1/2020 | Itoh et al. | |
| 2021/0225646 A1* | 7/2021 | Miyase | H01L 21/02378 |

FOREIGN PATENT DOCUMENTS

| | | | |
|---|---|---|---|
| JP | 2017-043525 A | | 3/2017 |
| JP | 2017-59670 A | | 3/2017 |
| JP | 2019208077 A | * 12/2019 |
| JP | 2020-170816 A | | 10/2020 |
| WO | 2005/034208 A2 | | 4/2005 |
| WO | 2017/141486 A1 | | 8/2017 |
| WO | 2018/142744 A1 | | 8/2018 |

* cited by examiner

SILICON CARBIDE EPITAXIAL SUBSTRATE AND SILICON CARBIDE SEMICONDUCTOR DEVICE

TECHNICAL FIELD

The present disclosure relates to a silicon carbide epitaxial substrate and a silicon carbide semiconductor device. This application claims priority based on Japanese Patent Application No. 2021-004753 filed on Jan. 15, 2021. The entire contents described in the Japanese Patent Application are incorporated herein by reference.

BACKGROUND ART

Japanese Unexamined Patent Application Publication No. 2017-043525 (PTL 1) describes a silicon carbide epitaxial wafer in which the ratio of the number of linear defects to the number of triangular defects is 0.2 to 2.

PRIOR ART DOCUMENT

Patent Literature

PTL 1: Japanese Unexamined Patent Application Publication No. 2017-043525

SUMMARY OF INVENTION

A silicon carbide epitaxial substrate according to the present disclosure includes a silicon carbide substrate and a silicon carbide epitaxial layer. The silicon carbide substrate includes a plurality of screw dislocations. The silicon carbide epitaxial layer is on the silicon carbide substrate. The silicon carbide epitaxial layer includes a buffer layer in contact with the silicon carbide substrate, a transition layer being on the buffer layer, and a drift layer being on the transition layer. The drift layer has a boundary surface in contact with the transition layer and a main surface opposite to the boundary surface. When a defect due to a first screw dislocation among the plurality of screw dislocations is a first defect, a defect due to a second screw dislocation among the plurality of screw dislocations is a second defect, an area density of the first defect is a first area density, and an area density of the second defect is a second area density, the first area density is $0.03/cm^2$ or more, and a value obtained by dividing the second area density by a sum of the first area density and the second area density is less than 2.91%. The first defect, as viewed perpendicularly to the main surface, is shaped to bifurcate from a first origin. No recessed groove is present on an imaginary line segment connecting both ends of the first defect. The second defect, as viewed perpendicularly to the main surface, includes a V-shaped defect bifurcating from a second origin and a trapezoidal defect contiguous to the V-shaped defect and having a trapezoidal shape. The trapezoidal defect has a first base contiguous to both ends of the V-shaped defect and a second base opposite to the first base. A recessed groove is present at the second base.

DETAILED DESCRIPTION

Figure 1:
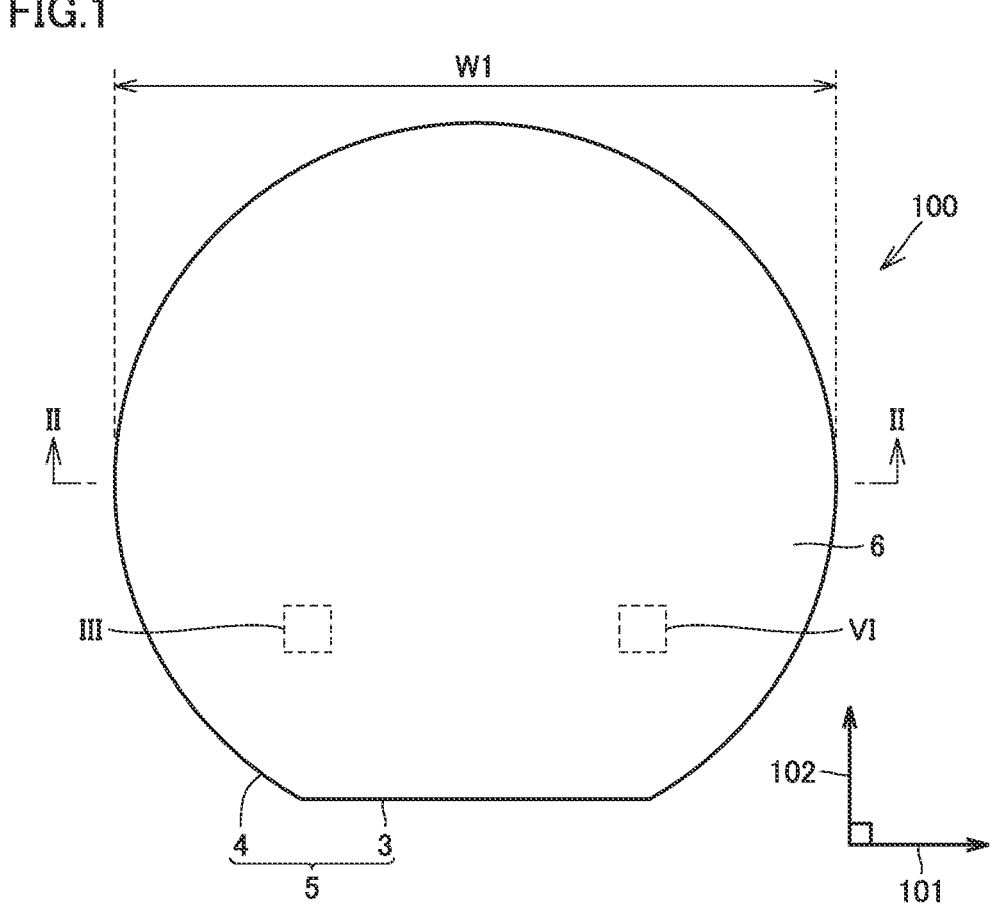
FIG. 1 is a schematic plan view showing the structure of a silicon carbide epitaxial substrate according to an embodiment of the present disclosure.

Problems to be Solved by the Present Disclosure

It is an object of the present disclosure to provide a silicon carbide epitaxial substrate capable of improving the yield of silicon carbide semiconductor devices.

Effects of the Present Disclosure

According to the present disclosure, it is possible to provide a silicon carbide epitaxial substrate capable of improving the yield of silicon carbide semiconductor devices.

Summary of Embodiments of Present Disclosure

First, an overview of embodiments of the present disclosure will be provided. Regarding crystallographic indications in the present specification, an individual orientation is represented by [ ], a group orientation is represented by < >, an individual plane is represented by ( ) and a group plane is represented by { }. Generally, a negative index is supposed to be crystallographically indicated by putting "-" (bar) above a numeral but is indicated by putting negative sign before the numeral in the present specification.

(1) A silicon carbide epitaxial substrate 100 according to the present disclosure includes a silicon carbide substrate 30 and a silicon carbide epitaxial layer 40. Silicon carbide substrate 30 includes a plurality of screw dislocations 110. Silicon carbide epitaxial layer 40 is on silicon carbide substrate 30. Silicon carbide epitaxial layer 40 includes a buffer layer 41 in contact with silicon carbide substrate 30, a transition layer 43 being on buffer layer 41, and a drift layer 42 being on transition layer 43. Drift layer 42 has a boundary surface 7 in contact with transition layer 43 and a main surface 6 opposite to boundary surface 7. When a defect due to a first screw dislocation 111 among the plurality of screw dislocations 110 is a first defect 10, a defect due to a second screw dislocation 112 among the plurality of screw dislocations 110 is a second defect 20, an area density of first defect 10 is a first area density, and an area density of second defect 20 is a second area density, the first area density is 0.03/cm² or more, and a value obtained by dividing the second area density by a sum of the first area density and the second area density is less than 2.91%. First defect 10, as viewed perpendicularly to main surface 6, is shaped to bifurcate from a first origin 14. No recessed groove is present on an imaginary line segment connecting both ends of first defect 10. Second defect 20, as viewed perpendicularly to main surface 6, includes a V-shaped defect 51 bifurcating from a second origin 24 and a trapezoidal defect 52 contiguous to V-shaped defect 51 and having a trapezoidal shape. Trapezoidal defect 52 has a first base 23 contiguous to both ends of V-shaped defect 51 and a second base 26 opposite to first base 23. A recessed groove is present at second base 26

(2) In silicon carbide epitaxial substrate 100 according to (1), V-shaped defect 51 and trapezoidal defect 52 may each include a stacking fault.

(3) In silicon carbide epitaxial substrate 100 according to (1) or (2), silicon carbide substrate 30 and silicon carbide epitaxial layer 40 may be each formed of 4H polytype silicon carbide. Trapezoidal defect 52 may include 3C polytype silicon carbide.

(4) In silicon carbide epitaxial substrate 100 according to any one of (1) to (3), the first area density may be 1/cm² or less.

(5) In silicon carbide epitaxial substrate 100 according to any one of (1) to (4), buffer layer 41 may have a thickness of 1 µm or more.

(6) In silicon carbide epitaxial substrate 100 according to any one of (1) to (5), when photoluminescence light generated from first defect 10 upon irradiation of first defect 10 with excitation light is expressed in RGB color space, R may be 147 to 187, G may be 137 to 162, and B may be 224 to 254.

(7) In silicon carbide epitaxial substrate 100 according to any one of (1) to (6), when photoluminescence light generated from V-shaped defect 51 upon irradiation of V-shaped defect 51 with excitation light is expressed in RGB color space, R may be 147 to 187, G may be 137 to 162, and B may be 224 to 254.

(8) In silicon carbide epitaxial substrate 100 according to any one of (1) to (7), when photoluminescence light generated from trapezoidal defect 52 upon irradiation of trapezoidal defect 52 with excitation light is expressed in RGB color space, R may be 56 to 115, G may be 71 to 128, and B may be 56 to 123.

(9) In silicon carbide epitaxial substrate 100 according to any one of (1) to (8), the value obtained by dividing the second area density by the sum of the first area density and the second area density is 2% or less

(10) A silicon carbide semiconductor device according to the present disclosure includes silicon carbide epitaxial substrate 100 according to any one of (1) to (9).

Details of Embodiments of Present Disclosure

The details of embodiments of the present disclosure are set forth below. In the following description, identical or corresponding elements are provided with the same reference signs and will not be described repeatedly.

Silicon Carbide Epitaxial Substrate

Figure 2:
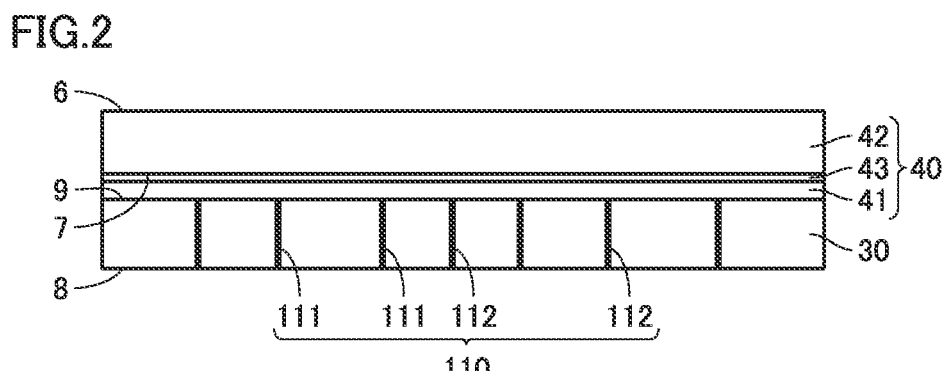
FIG. 2 is a schematic cross-sectional view taken along line II-II of FIG. 1.

FIG. 1 is a schematic plan view illustrating a configuration of a silicon carbide epitaxial substrate 100 according to an embodiment of the present disclosure. FIG. 2 is a schematic cross-sectional view taken along line II-II of FIG. 1. As shown in FIGS. 1 and 2, silicon carbide epitaxial substrate 100 according to an embodiment of the present disclosure includes a silicon carbide substrate 30 and a silicon carbide epitaxial layer 40. Silicon carbide epitaxial layer 40 is on silicon carbide substrate 30. Silicon carbide epitaxial layer 40 is in contact with silicon carbide substrate 30. Silicon carbide epitaxial layer 40 has a first main surface 6.

Silicon carbide epitaxial layer 40 includes the surface (first main surface 6) of silicon carbide epitaxial substrate 100. Silicon carbide substrate 30 includes a surface (a second main surface 8) of silicon carbide epitaxial substrate 100. As shown in FIG. 1, silicon carbide epitaxial substrate 100 has an outer peripheral edge 5. Outer peripheral edge 5 has, for example, an orientation flat 3 and an arc-shaped portion 4. Orientation flat 3 extends along a first direction 101. As shown in FIG. 1, orientation flat 3 is linear as viewed in a direction perpendicular to first main surface 6. Arc-shaped portion 4 is contiguous to orientation flat 3. Arc-shaped portion 4 is arc-shaped as viewed in a direction perpendicular to first main surface 6.

As shown in FIG. 1, as viewed in a direction perpendicular to first main surface 6, first main surface 6 extends along each of first direction 101 and a second direction 102. As viewed in a direction perpendicular to first main surface 6, first direction 101 is perpendicular to second direction 102.

First direction 101 is, for example, the <11-20> direction. First direction 101 may be, for example, the [11-20] direction. First direction 101 may be the direction obtained by projecting the <11-20> direction onto first main surface 6. From another viewpoint, first direction 101 may be, for example, the direction including the <11-20> direction component.

Second direction 102 is, for example, the <1-100> direction. Second direction 102 may be, for example, the [1-100] direction. Second direction 102 may be, for example, the direction obtained by projecting the <1-100> direction onto first main surface 6. From another viewpoint, second direction 102 may be, for example, the direction including the <1-100> direction component.

First main surface 6 may be the surface inclined with respect to the {0001} plane. When first main surface 6 is inclined with respect to the {0001} plane, the inclination angle (off angle) with respect to the {0001} plane is 2° to 6°, for example. When first main surface 6 is inclined with respect to the {0001} plane, the inclination direction (off direction) of first main surface 6 is, for example, the <11-20> direction. In other words, first direction 101 may be the off direction of first main surface 6.

As shown in FIG. 1, a maximum diameter W1 (a diameter) of first main surface 6 is not particularly limited, but is, for example, 100 mm (4 inches). Maximum diameter W1 may be 125 mm or greater (5 inches) or 150 mm or greater (6 inches). The upper limit of maximum diameter W1 is not particularly limited. Maximum diameter W1 may be 200 mm or less (8 inches), for example. Maximum diameter W1 is the maximum distance between any two points on outer peripheral edge 5.

As used herein, 2 inches refers to 50 mm or 50.8 mm (2 inches×25.4 mm/inch). 4 inches refers to 100 mm or 101.6 mm (4 inches×25.4 mm/inch). 5 inches refers to 125 mm or 127.0 mm (5 inches×25.4 mm/inch). 6 inches refers to 150 mm or 152.4 mm (6 inches×25.4 mm/inch). 8 inches refers to 200 mm or 203.2 mm (8 inches×25.4 mm/inch).

As shown in FIG. 2, silicon carbide substrate 30 includes a plurality of screw dislocations 110. Silicon carbide substrate 30 has second main surface 8 and a third main surface 9. Third main surface 9 is opposite to second main surface 8. Second main surface 8 is a back surface of silicon carbide epitaxial substrate 100. Second main surface 8 is spaced apart from silicon carbide epitaxial layer 40. Third main surface 9 is in contact with silicon carbide epitaxial layer 40. The polytype of silicon carbide constituting silicon carbide substrate 30 is, for example, 4H. Similarly, the polytype of silicon carbide constituting silicon carbide epitaxial layer 40 is, for example, 4H.

As shown in FIG. 2, silicon carbide epitaxial layer 40 includes a buffer layer 41, a transition layer 43, and a drift layer 42. Drift layer 42 may be one layer or two or more layers. Buffer layer 41 is on silicon carbide substrate 30. Buffer layer 41 is in contact with silicon carbide substrate 30. Transition layer 43 is on buffer layer 41. Transition layer 43 is in contact with buffer layer 41. Drift layer 42 is on transition layer 43. Drift layer 42 is in contact with transition layer 43. Drift layer 42 includes first main surface 6 and a boundary surface 7. Boundary surface 7 is in contact with transition layer 43. First main surface 6 is opposite to boundary surface 7.

Silicon carbide substrate 30 contains an n-type impurity such as nitrogen (N). The conductivity type of silicon carbide substrate 30 is, for example, n-type. Silicon carbide substrate 30 has a thickness of 200 μm to 500 μm, for example. Silicon carbide epitaxial layer 40 contains an n-type impurity such as nitrogen. The conductivity type of silicon carbide epitaxial layer 40 is, for example, n-type.

The concentration of the n-type impurity contained in buffer layer 41 may be lower than the concentration of the n-type impurity contained in silicon carbide substrate 30. The concentration of the n-type impurity contained in drift layer 42 may be lower than the concentration of the n-type impurity contained in buffer layer 41. The concentration of the n-type impurity contained in transition layer 43 may be lower than the concentration of the n-type impurity contained in buffer layer 41 and higher than the concentration of the n-type impurity contained in drift layer 42. The concentration of the n-type impurity contained in transition layer 43 may monotonically decrease from buffer layer 41 toward drift layer 42. The concentration of the n-type impurity contained in drift layer 42 is, for example, about $1 \times 10^{15}$ cm$^{-3}$ to $1 \times 10^{17}$ cm$^{-3}$. The concentration of the n-type impurity contained in buffer layer 41 is higher than $1 \times 10^{17}$ cm$^3$ and $1 \times 10^{19}$ cm$^{-3}$ or less, for example. The concentration of the n-type impurity contained in transition layer 43 is $1 \times 10^{15}$ cm$^{-3}$ to $1 \times 10^{19}$ cm$^{-3}$, for example.

Figure 3:
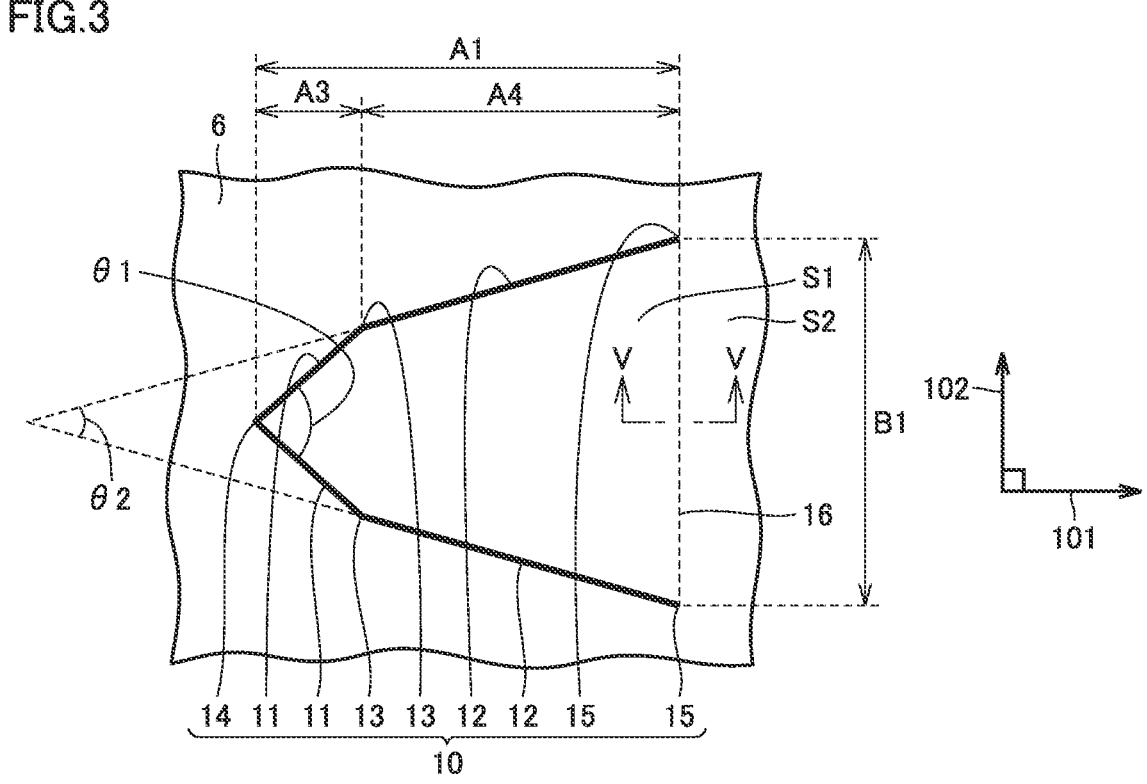
FIG. 3 is an enlarged plan view of region III of FIG. 1.

FIG. 3 is an enlarged plan view of region III of FIG. 1. As shown in FIG. 3, first main surface 6 has a first defect 10. First defect 10 is, for example, an external Frank-type stacking fault. First defect 10 has a first origin 14. As shown in FIG. 3, as viewed in the direction perpendicular to first main surface 6, first defect 10 is shaped to bifurcate from first origin 14. In other words, first defect 10 is V-shaped as viewed in the direction perpendicular to first main surface 6. First defect 10 may include a pair of first straight portions 11, a pair of second straight portions 12, and a pair of first end portions 15. Each of the pair of first straight portions 11 is connected to first origin 14. The pair of first straight portions 11 is bifurcated from first origin 14.

As shown in FIG. 3, as viewed in a direction perpendicular to first main surface 6, each of the pair of first straight portions 11 is inclined with respect to a straight line parallel to first direction 101. One of the pair of first straight portions 11 may be inclined in second direction 102 from a straight line parallel to first direction 101. The other of the pair of first straight portions 11 may be inclined from a straight line parallel to first direction 101 to a side opposite to second direction 102.

As shown in FIG. 3, each of the pair of second straight portions 12 is contiguous to each of the pair of first straight portions 11. As viewed in a direction perpendicular to first main surface 6, each of the pair of second straight portions 12 may be inclined with respect to each of the pair of first straight portions 11. As another aspect, each of the pair of second straight portions 12 may be parallel to each of the pair of first straight portions 11.

As shown in FIG. 3, as viewed in a direction perpendicular to first main surface 6, each of the pair of second straight portions 12 is inclined with respect to a straight line parallel to first direction 101. One of the pair of second straight portions 12 may be inclined in second direction 102 from a straight line parallel to first direction 101. The other of the pair of second straight portions 12 may be inclined from a straight line parallel to first direction 101 in a direction opposite to second direction 102.

As shown in FIG. 3, as viewed in the direction perpendicular to first main surface 6, an angle (a first angle θ1) formed by each of the pair of first straight portions 11 is 45° to 135°, for example. As shown in FIG. 3, as viewed in the direction perpendicular to first main surface 6, an angle (a second angle θ2) formed by each of the pair of second straight portions 12 may be smaller than the angle (first angle θ1) formed by each of the pair of first straight portions 11. Second angle θ2 may be, for example, 15° to 90°.

As shown in FIG. 3, an imaginary line segment 16 passing through the pair of first end portions 15 may be parallel to a straight line along second direction 102. A length (a first length A1) of first defect 10 along first direction 101 may be greater than a width (a first width B1) of first defect 10 along second direction 102. The width (first width B1) of first defect 10 along second direction 102 may be the same as a distance between the pair of first end portions 15. In a direction along first direction 101, a length (a fourth length A4) of second straight portion 12 may be longer than a length (a third length A3) of first straight portion 11.

Figure 4:
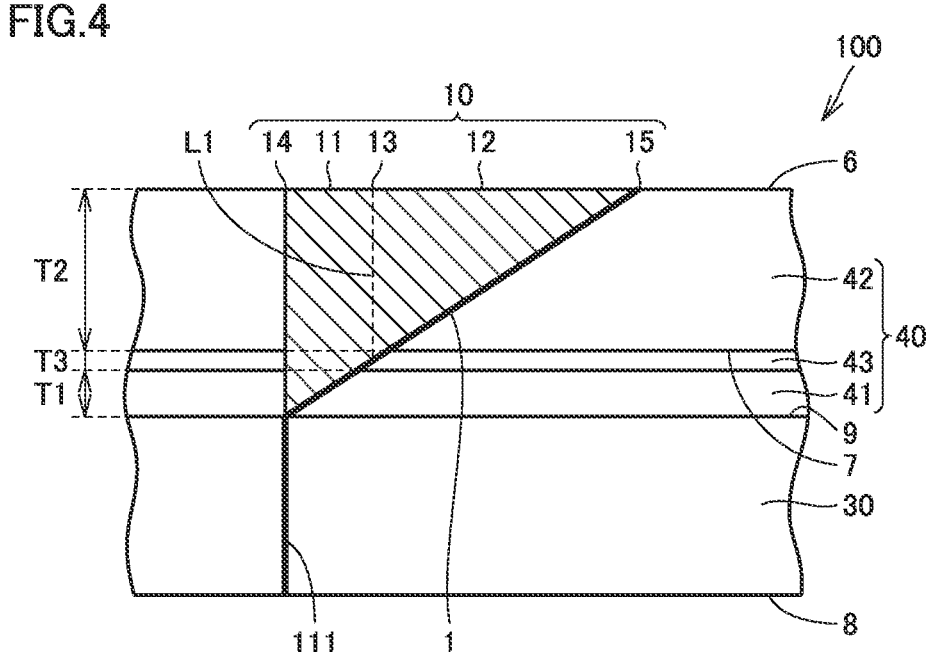
FIG. 4 is a schematic cross-sectional view showing a configuration of a first defect.

FIG. 4 is a schematic cross-sectional view showing the structure of first defect 10. The cross-section shown in FIG. 4 is perpendicular to first main surface 6. As shown in FIG. 4, first defect 10 is due to a first screw dislocation 111 among plurality of screw dislocations 110. Specifically, first defect 10 may be contiguous to first screw dislocation 111. Silicon carbide epitaxial substrate 100 may have a first basal plane dislocation 1. First basal plane dislocation 1 is contiguous to first screw dislocation 111.

First basal plane dislocation 1 penetrates each of buffer layer 41, transition layer 43, and drift layer 42. First basal plane dislocation 1 extends from third main surface 9 to first main surface 6. First basal plane dislocation 1 may be contiguous to first end portion 15 on first main surface 6. As shown in FIG. 4, each of first origin 14, first straight portion 11, and second straight portion 12 may be located above first basal plane dislocation 1. First origin 14 may be located on a straight line extending along first screw dislocation 111. As shown in FIG. 4, a straight line (a first straight line L1) passing through a boundary 13 between first straight portion 11 and second straight portion 12 and perpendicular to first main surface 6 may be in contact with first basal plane dislocation 1 in transition layer 43.

As shown in FIG. 3, first main surface 6 has a region (a first region S1) surrounded by a pair of first straight portions 11, a pair of second straight portions 12, and imaginary line segment 16 connecting the pair of first end portions 15, and a second region S2 outside first region S1. First defect 10 includes first region S1. First region S1 includes a stacking fault. First region S1 includes, for example, an external Frank-type stacking fault. Second region S2 is a region composed of 4H—SiC that does not include a stacking fault.

Buffer layer 41 may have a thickness (a first thickness T1) of, for example, 0.5 μm or more. The lower limit of first thickness T1 is not particularly limited, and may be, for example, 1.5 μm or more or 2 μm or more. The upper limit of first thickness T1 is not particularly limited, and may be, for example, 5 μm or less or 4 μm or less. A thickness (a third thickness T3) of transition layer 43 may be less than first thickness T1. A thickness (a second thickness T2) of drift layer 42 may be greater than a thickness of buffer layer 41.

Figure 5:
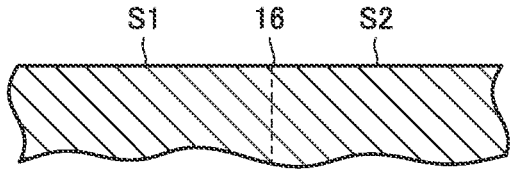
FIG. 5 is a schematic cross-sectional view taken along line V-V of FIG. 3.

FIG. 5 is a schematic cross-sectional view taken along line V-V of FIG. 3. As shown in FIG. 5, in the cross section taken along the line V-V, no recessed groove is present at the boundary between first region S1 and second region S2. Specifically, when second main surface 8 is used as a reference surface, the height of first region S1 is substantially the same as the height of second region S2 in a direction perpendicular to first main surface 6. In other words, no recessed groove is present on imaginary line segment 16 connecting both ends (each of the pair of first end portions 15) of first defect 10. The case where no recessed groove is present refers to a case where a height difference is 5 nm or less when a height difference analysis is performed using a white light microscope.

Figure 6:
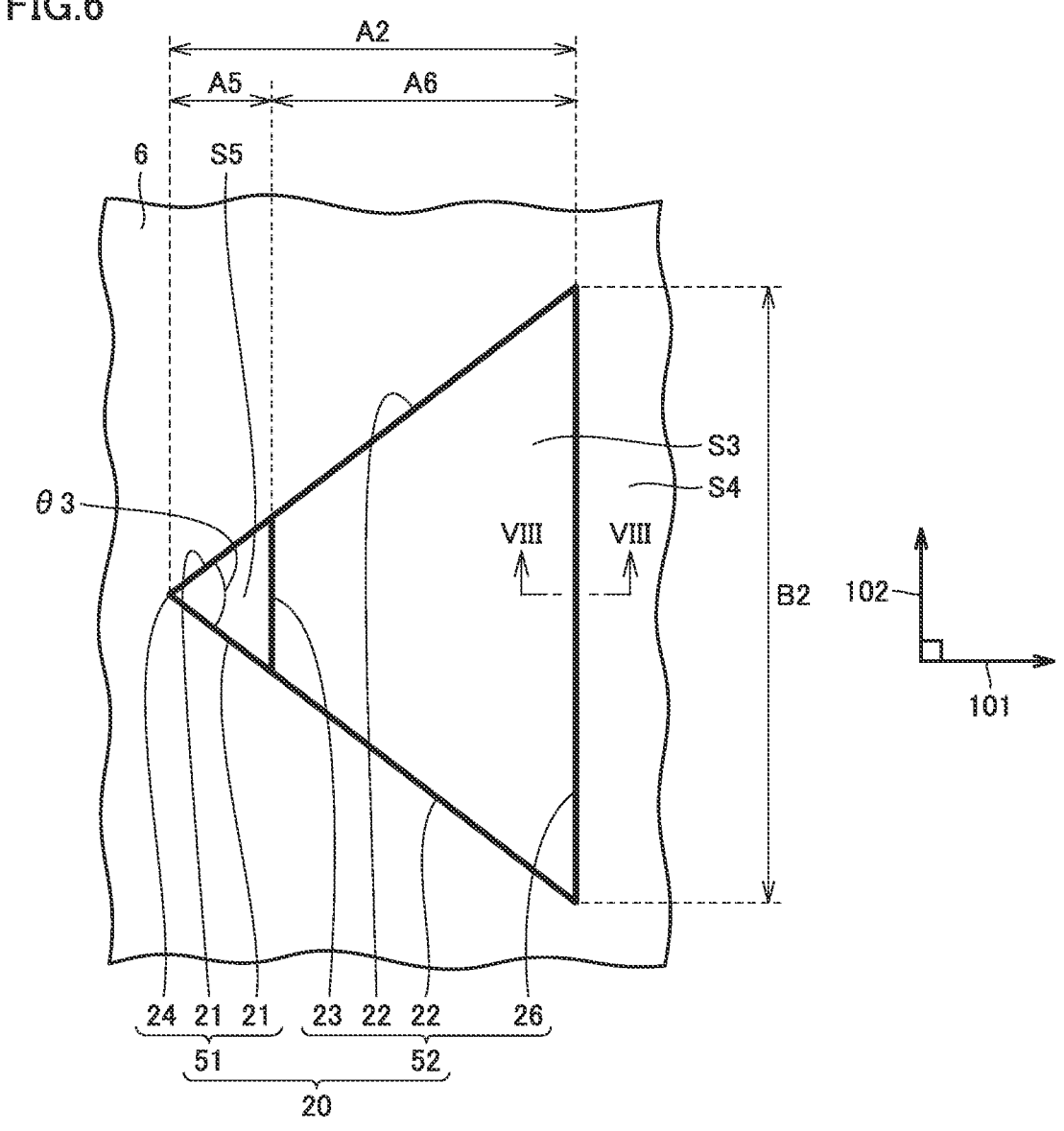
FIG. 6 is an enlarged plan view of region VI of FIG. 1.

FIG. 6 is an enlarged plan view of region VI of FIG. 1. As shown in FIG. 6, first main surface 6 has a second defect 20. As shown in FIG. 6, second defect 20 has a V-shaped defect 51 and a trapezoidal defect 52. V-shaped defect 51 has a V-shape as viewed in a direction perpendicular to first main surface 6. V-shaped defect 51 has a second origin 24 and a pair of third straight portions 21. V-shaped defect 51 is bifurcated from second origin 24. Specifically, the pair of third straight portions 21 is contiguous to second origin 24. In other words, each of the pair of third straight portions 21 is connected at second origin 24. V-shaped defect 51 is, for example, a stacking fault. V-shaped defect 51 may be, for example, an external Frank-type stacking fault.

As shown in FIG. 6, trapezoidal defect 52 has a trapezoidal shape as viewed in a direction perpendicular to first main surface 6. Trapezoidal defect 52 is contiguous to V-shaped defect 51. Trapezoidal defect 52 includes a first base 23, a second base 26, and a pair of fourth straight portions 22. First base 23 is contiguous to both ends of the V-shaped defect. One end of first base 23 is contiguous to one of the pair of third straight portions 21. The other end of first base 23 is contiguous to the other of the pair of third straight portions 21. Second base 26 is opposite to first base 23. One end of each of the pair of fourth straight portions 22 is contiguous to first base 23. The other end of each of the pair of fourth straight portions 22 is contiguous to second base 26. Trapezoidal defect 52 is, for example, a region whose polytype is 3C. Trapezoidal defect 52 may be, for example, a stacking fault.

As shown in FIG. 6, as viewed in a direction perpendicular to first main surface 6, the length of second base 26 is longer than the length of first base 23. As viewed in a direction perpendicular to first main surface 6, each of second base 26 and first base 23 extends along a direction parallel to second direction 102. One of the pair of third straight portions 21 is contiguous to one of the pair of fourth straight portions 22 at one end of first base 23. The other of the pair of third straight portions 21 is contiguous to the other of the pair of fourth straight portions 22 at the other end of first base 23.

As shown in FIG. 6, as viewed in the direction perpendicular to first main surface 6, an angle (third angle θ3) formed by each of the pair of third straight portions 21 is 45° to 135°, for example. As viewed in a direction perpendicular to first main surface 6, each of the pair of third straight portions 21 is inclined with respect to a straight line parallel to first direction 101. One of the pair of third straight portions 21 may be inclined in second direction 102 from a straight line parallel to first direction 101. The other of the pair of third straight portions 21 may be inclined from a straight line parallel to first direction 101 toward a side opposite to second direction 102.

As shown in FIG. 6, as viewed in a direction perpendicular to first main surface 6, each of the pair of fourth straight portions 22 is inclined with respect to a straight line parallel to first direction 101. One of the pair of fourth straight portions 22 may be inclined in second direction 102 from a straight line parallel to first direction 101. The other of the pair of fourth straight portions 22 may be inclined from a straight line parallel to first direction 101 in a direction opposite to second direction 102.

As viewed in a direction perpendicular to first main surface 6, one of the pair of fourth straight portions 22 may be parallel to one of the pair of third straight portions 21 or may be inclined with respect to one of the pair of third straight portions 21. As viewed in the direction perpendicular to first main surface 6, the other of the pair of fourth straight portions 22 may be parallel to the other of the pair of third straight portions 21, or may be inclined with respect to the other of the pair of third straight portions 21.

A length (a second length A2) of second defect 20 along first direction 101 may be less than a width (a second width B2) of second defect 20 along second direction 102. On the contrary, the length (second length A2) of second defect 20 along first direction 101 may be equal to or greater than the width (second width B2) of second defect 20 along second direction 102. In the direction along first direction 101, a length (a sixth length A6) of trapezoidal defect 52 may be longer than a length (a fifth length A5) of V-shaped defect 51.

Figure 7:
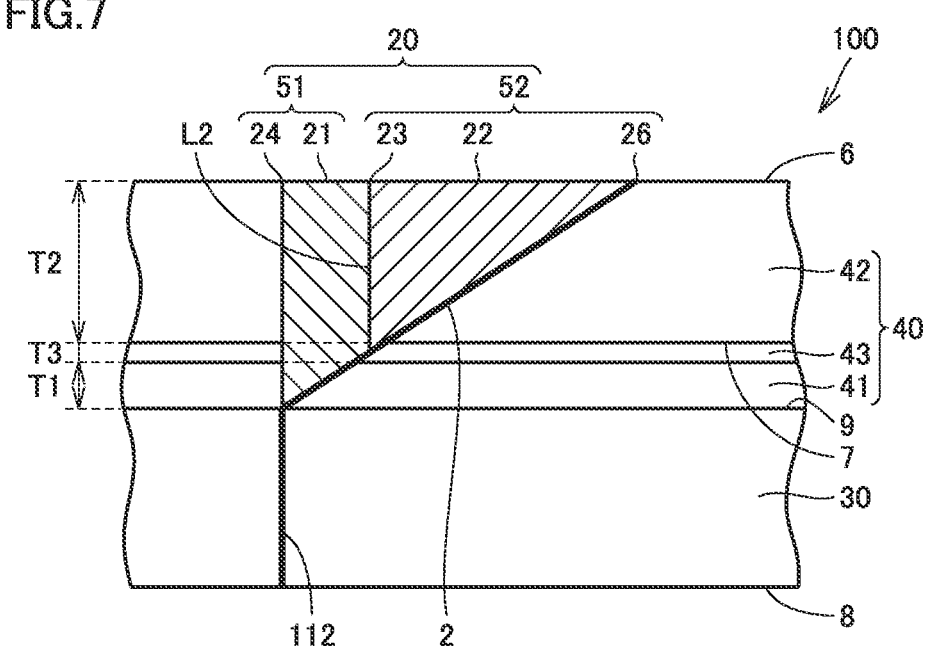
FIG. 7 is a schematic cross-sectional view showing a configuration of a second defect.

FIG. 7 is a schematic cross-sectional view showing the structure of second defect 20. The cross-section shown in FIG. 7 is perpendicular to first main surface 6. As shown in FIG. 7, second defect 20 is due to a second screw dislocation 112 among plurality of screw dislocations 110. Specifically, second defect 20 may be contiguous to second screw dislocation 112. Silicon carbide epitaxial substrate 100 may have a second basal plane dislocation 2. Second basal plane dislocation 2 is contiguous to second screw dislocation 112.

Second basal plane dislocation 2 penetrates each of buffer layer 41, transition layer 43, and drift layer 42. Second basal plane dislocation 2 extends from third main surface 9 to first main surface 6. Second basal plane dislocation 2 may be contiguous to second base 26 on first main surface 6. As shown in FIG. 7, each of second origin 24, third straight portion 21 and fourth straight portion 22 may be located above second basal plane dislocation 2. Second origin 24 may be located on a straight line extending along second screw dislocation 112. As shown in FIG. 7, a straight line (a second straight line L2) passing through first base 23 and perpendicular to first main surface 6 may be in contact with second basal plane dislocation 2 in transition layer 43.

As shown in FIG. 6, first main surface 6 has a region (a fifth region S5) surrounded by the pair of third straight portions 21 and first base 23, a region (a third region S3) surrounded by trapezoidal defect 52, and a region (a fourth region S4) outside each of third region S3 and fifth region S5. The polytype of silicon carbide constituting fourth region S4 is 4H Third region S3 includes 3C—SiC. In third region S3, 4H—SiC and 3C—SiC may be mixed. In third region S3, 3C—SiC may be filled in a depth direction. The polytype of silicon carbide constituting fifth region S5 is 4H. Fifth region S5 includes a stacking fault. Fifth region S5 includes, for example, an external Frank-type stacking fault. Fourth region S4 is a region including 4H—SiC that does not include a stacking fault.

Figure 8:
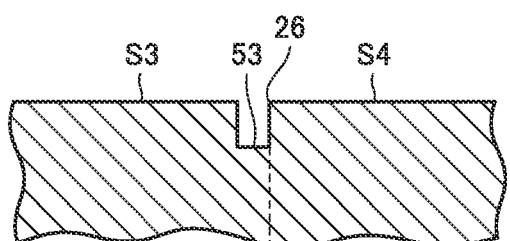
FIG. 8 is a schematic cross-sectional view taken along line VIII-VIII of FIG. 6.

FIG. 8 is a schematic cross-sectional view taken along line VIII-VIII of FIG. 6. As shown in FIG. 8, in the cross section taken along the line VIII-VIII, a recessed groove 53 is present at the boundary between third region S3 and fourth region S4. Recessed groove 53 is contiguous to second base 26 of trapezoidal defect 52. In the direction perpendicular to first main surface 6, the depth of recessed groove 53 is not particularly limited, but is 5 nm or more, for example.

In silicon carbide epitaxial substrate 100 according to the embodiment of the present disclosure, when an area density of first defects 10 is defined as a first area density and an area density of second defects 20 is defined as a second area density, the first area density is 0.03/cm$^2$ or more and a value obtained by dividing the second area density by a sum of the first area density and the second area density is less than 2.91%.

The lower limit of the first area density is not particularly limited, and may be, for example, 0.10/cm$^2$ or more or 0.20/cm$^2$ or more. The upper limit of the first area density is not particularly limited, and may be, for example, 0.80/cm$^2$ or less or 1/cm$^2$ or less.

The second area density may be 0, for example. In other words, second defect 20 may not be present in first main surface 6. The lower limit of the second area density is not particularly limited, and may be, for example, 0.001/cm$^2$ or more or 0.002/cm$^2$ or more. The upper limit of the second area density is not particularly limited, and may be, for example, 0.10/cm$^2$ or less or 0.01/cm$^2$ or less.

The value obtained by dividing the second area density by the sum of the first area density and the second area density may be 0, for example. The lower limit of the value obtained by dividing the second area density by the sum of the first area density and the second area density is not particularly limited, and may be, for example, 0.1% or more or 0.5% or more. The upper limit of the value obtained by dividing the second area density by the sum of the first area density and the second area density is not particularly limited, and may be, for example, 2.5% or less, 2% or less, or 1.5% or less.

Next, a method for specifying the area density of each of first defect 10 and second defect 20 will be described. The area density of each of first defect 10 and second defect 20 is determined by observing first main surface 6 of silicon carbide epitaxial substrate 100 using a defect inspection apparatus having a confocal differential interference contrast microscope. As a defect inspection apparatus having a confocal differential interference contrast microscope, for example, WASAVI series "SICA 6X" manufactured by Lasertec Corporation can be used. The magnification of the objective lens is, for example, 10 times. First main surface 6 of silicon carbide epitaxial substrate 100 is irradiated with light having a wave length of 546 nm from a light source such as a mercury xenon lamp, and the reflection light of the light is observed by a light receiving device. Each of first defect 10 and second defect 20 is defined in consideration of a planar shape of each of first defect 10 and second defect

20. Based on the observed image, each of first defect 10 and second defect 20 is specified. "Thresh S" which is an index of the measurement sensitivity of SICA is set to 40, for example.

While moving silicon carbide epitaxial substrate 100 in a direction parallel to first main surface 6, a confocal differential interference contrast microscope image of the whole of first main surface 6 is captured. In the obtained confocal differential interference contrast microscope image, the area density of first defect 10 and second defect 20 is obtained. Specifically, a value obtained by dividing the number of first defects 10 by the observation area of first main surface 6 is set as the area density of first defects 10. Similarly, a value obtained by dividing the number of second defects 20 by the observation area of first main surface 6 is set as the area density of second defects 20.

Next, a method for measuring optical characteristics of each of first defect 10 and second defect 20 will be described.

Figure 9:
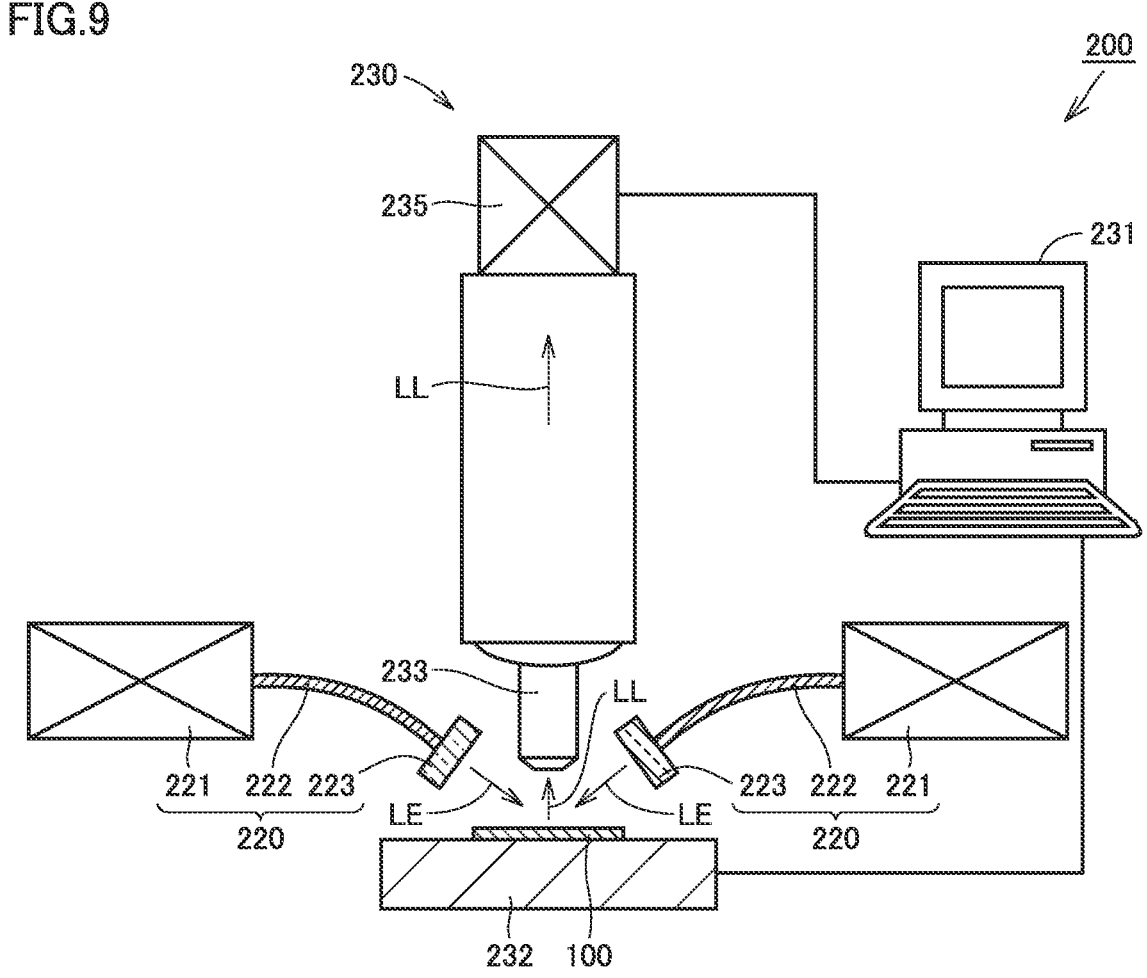
FIG. 9 is a schematic diagram showing a configuration of a photoluminescence imaging apparatus.

The optical characteristics of each of first defect 10 and second defect 20 can be measured by, for example, a photoluminescence imaging apparatus. FIG. 9 is a schematic diagram showing the configuration of a photoluminescence imaging apparatus. As shown in FIG. 9, a photoluminescence imaging apparatus 200 mainly includes an excitation light generation unit 220 and an imaging unit 230.

Excitation light generation unit 220 includes a light source 221, a light guide 222, and a filter 223. Light source 221 can generate an excitation light LE having an energy higher than the band gap of hexagonal silicon carbide. Light source 221 is, for example, a mercury xenon lamp. Light guide 222 may guide light emitted from light source 221 such that the light is irradiated onto first main surface 6 of silicon carbide epitaxial substrate 100. Light guide 222 includes, for example, an optical fiber. As shown in FIG. 9, excitation light generation unit 220 may be located on either side of a near-infrared objective lens 233.

Filter 223 selectively transmits light having a specific wavelength corresponding to the energy higher than the band gap of hexagonal silicon carbide. Wavelengths corresponding to the band gap of hexagonal silicon carbide are typically on the order of 390 nm. For this purpose, for example, a bandpass filter is used as filter 223, which in particular transmits light having wavelengths of approximately 313 nm. The transmission band of filter 223 may be, for example, 290 nm to 370 nm, 300 nm to 330 nm, or 300 nm to 320 nm.

Imaging unit 230 mainly includes a controller 231, a stage 232, near-infrared objective lens 233, and a color image sensor 235. Controller 231 controls a displacement operation of stage 232 and a photographing operation by color image sensor 235, and is, for example, a personal computer. Stage 232 supports silicon carbide epitaxial substrate 100 such that first main surface 6 is exposed. Stage 232 is, for example, an XY stage that displaces the position of first main surface 6. Near-infrared objective lens 233 is disposed above first main surface 6. The magnification of near-infrared objective lens 233 is, for example, 4.5 times. Color image sensor 235 receives photoluminescence light generated from silicon carbide epitaxial substrate 100.

Next, a method for measuring the optical characteristics of first defect 10 and second defect 20 will be described. First, excitation light LE is irradiated to first main surface 6 of silicon carbide epitaxial substrate 100 using excitation light generation unit 220. Accordingly, a photoluminescence light LL is generated from silicon carbide epitaxial substrate 100. The wavelength of excitation light LE is, for example, 313 nm. The intensity of excitation light LE is, for example, 0.1 mW/cm² to 2 W/cm². The exposure time of the irradiation light is 0.5 seconds to 120 seconds, for example.

Next, photoluminescence light is detected by the color image sensor. In detail, photoluminescence light LL generated from silicon carbide epitaxial substrate 100 is detected by color image sensor 235. Color image sensor 235 is, for example, a charge-coupled device (CCD) image sensor. The type of CCD is, for example, a back-illuminated deep depletion type. The CCD image sensor is, for example, eXcelon™ manufactured by Cypress Semiconductor Inc. The range of imaging wavelengths is, for example, 310 nm to 1024 nm. The device format is, for example, 1024ch× 1024ch. The image area is, for example, 13.3 mm×13.3 mm. The device size is, for example, 13 μm×13 μm. The number of pixels is, for example, 480 pixel×640 pixel. The image size is, for example, 1.9 mm×2.6 mm.

Color image sensor 235 may be, for example, a CMOS (complementary metal oxide semiconductor) image sensor. The CMOS image sensor is, for example, ORCA™—Fusion manufactured by HAMAMATSU PHOTONICS K.K. The range of imaging wavelengths is, for example, 350 nm to 1000 nm. The effective device size is 14.98 mm×14.98 mm. The pixel size is 6.5 μm×6.5 μm. Optical characteristics of each of first defect 10 and second defect 20 in first main surface 6 of silicon carbide epitaxial substrate 100 are specified based on the color image obtained from the color image sensor.

Figure 10:
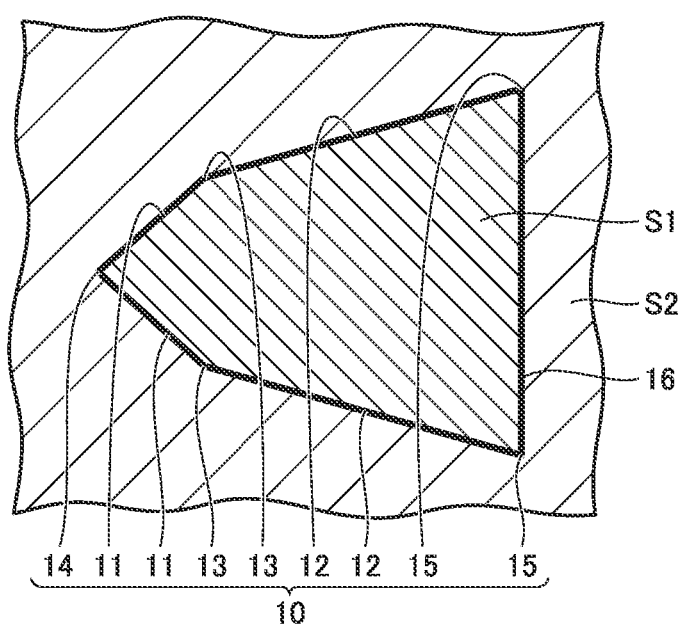
FIG. 10 is a schematic diagram showing a first defect shown in a color image obtained from a color image sensor.

FIG. 10 is a schematic diagram showing first defect 10 shown in a color image obtained from a color image sensor. In the schematic diagram shown in FIG. 10, the color of first region S1 is different from the color of second region S2. First region S1 is a region in which first defect 10 is present. Second region S2 is a region where first defect 10 is not present. The color of first region S1 is, for example, purple. The color of second region S2 is, for example, gray. The color of first defect 10 can be represented by an RGB color space. Specifically, when photoluminescence light generated from first defect 10 upon irradiation of first defect 10 with excitation light is expressed in RGB color space, R may be 147 to 187, G may be 137 to 162, and B may be 224 to 254.

Figure 11:
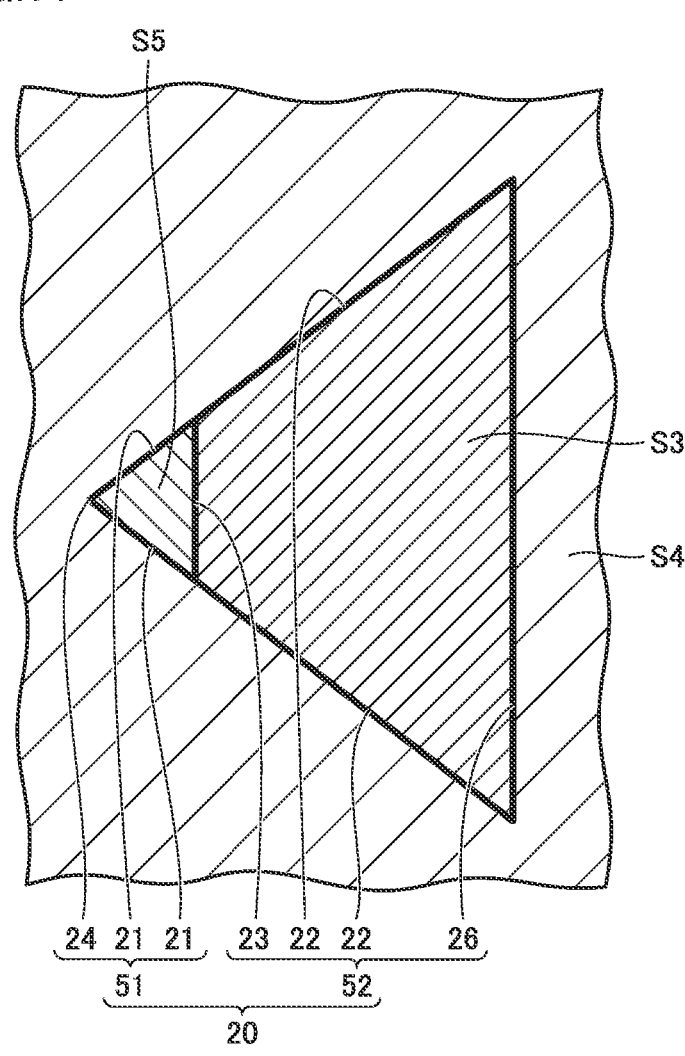
FIG. 11 is a schematic diagram showing a second defect shown in a color image obtained from a color image sensor.

FIG. 11 is a schematic diagram showing second defect 20 shown in a color image obtained from a color image sensor. In the schematic diagram shown in FIG. 11, the color of third region S3, the color of fourth region S4, and the color of fifth region S5 are different from each other. Third region S3 and fifth region S5 are regions where second defect 20 is present. Fourth region S4 is a region where second defect 20 is not present. Fifth region S5 is a region in which V-shaped defect 51 is present. Third region S3 is a region where trapezoidal defect 52 is not present. The color of third region S3 is, for example, black. The color of fourth region S4 is, for example, gray. The color of fifth region S5 is, for example, a purple-based color. The color of fourth region S4 may be the same as the color of second region S2.

The color of V-shaped defect 51 can be represented by an RGB color space. Specifically, when photoluminescence light generated from V-shaped defect 51 upon irradiation of V-shaped defect 51 with excitation light is expressed in RGB color space, R may be 147 to 187, G may be 137 to 162, and B may be 224 to 254.

The color of trapezoidal defect 52 can be represented by an RGB color space. Specifically, when photoluminescence light generated from trapezoidal defect 52 with excitation light is expressed in RGB color space, R may be 56 to 115, G may be 71 to 128, and B may be 56 to 123.

Note that the RGB color space is one of color representation methods for representing a color by red, green, and blue. In the RGB color space, the range of R is 0 to 255, the range of G is 0 to 255, and the range of B is 0 to 255 R, G, and B are represented by decimal numbers, for example. Each of first defect 10 and second defect 20 may be specified based on the RGB color space obtained from the color image sensor.

The regions of different colors have different optical properties. The regions of different colors correspond to different types of defects. As types of defects of silicon carbide, there are an internal Frank-type stacking fault, an external Frank-type stacking fault, a double Shockley-type stacking fault, a single Shockley-type stacking fault, a quadruple Shockley-type stacking fault, a triple Shockley-type stacking fault, and the like. The optical characteristics of the stacking fault of 3C polytype silicon carbide are different from the optical characteristics of the stacking fault of 4H polytype silicon carbide. Trapezoidal defect 52 may be a different type of stacking fault from V-shaped defect 51.

(Method of Manufacturing Silicon Carbide Epitaxial Substrate)

Next, a method of manufacturing a silicon carbide epitaxial substrate according to an embodiment of the present disclosure will be described.

First, silicon carbide substrate 30 is prepared. For example, a 4H polytype silicon carbide single crystal is produced by a sublimation method. Next, silicon carbide substrate 30 is prepared by slicing a silicon carbide single crystal with, for example, a wire saw Silicon carbide substrate 30 contains an n-type impurity such as nitrogen. The conductivity type of silicon carbide substrate 30 is, for example, n-type. Next, mechanical polishing is performed on silicon carbide substrate 30. Next, chemical mechanical polishing is performed on silicon carbide substrate 30.

Next, silicon carbide epitaxial layer 40 is formed on silicon carbide substrate 30. Specifically, silicon carbide epitaxial layer 40 is formed by epitaxial growth on third main surface 9 of silicon carbide substrate 30 by a CVD (Chemical Vapor Deposition) method, for example. In the epitaxial growth, for example, silane (SiH₄) and propane (C₃H₈) are used as source gases, and hydrogen (H₂) is used as a carrier gas. The temperature of the epitaxial growth is, for example, about 1400° C. to 1700° C. During epitaxial growth, n-type impurities such as nitrogen are introduced into silicon carbide epitaxial layer 40.

Figure 12:
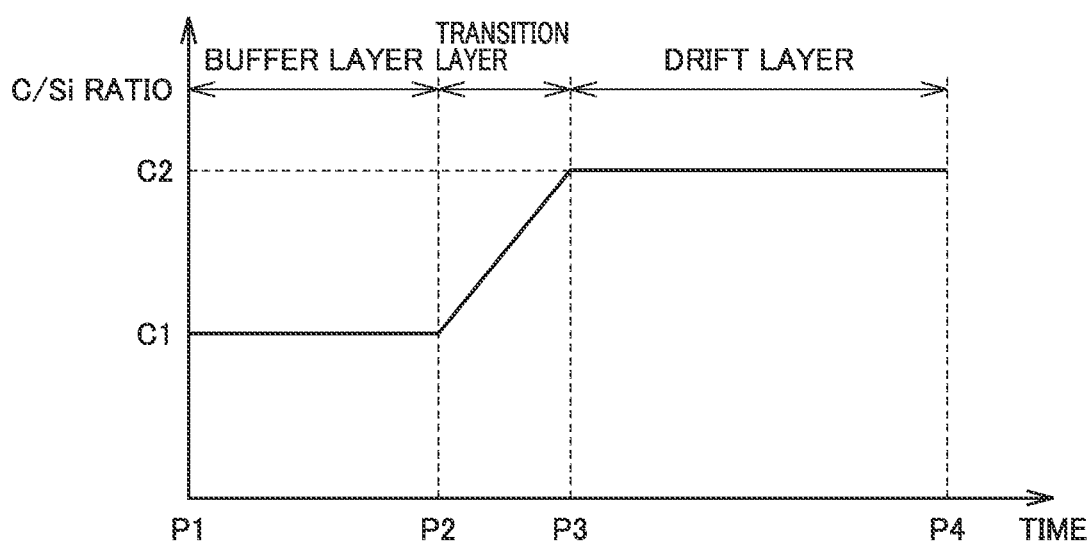
FIG. 12 is a schematic diagram showing the relationship between the C/Si ratio and time.

FIG. 12 is a schematic diagram showing the relationship between the C/Si ratio and time. The C/Si ratio is a value (dimensionless) obtained by dividing the number of carbon (C) atoms contained in the raw material gas by the number of silicon (Si) atoms contained in the raw material gas. As shown in FIG. 12, at the first time point, the C/Si ratio is a first ratio C1. From a first time point P1 to a second time point P2, the C/Si ratio is maintained at first ratio C1. Buffer layer 41 is formed on silicon carbide substrate 30 between first time point P1 and second time point P2. The C/Si ratio monotonically increases from second time point P2 to a third time point P3. From second time point P2 to third time point P3, the C/Si ratio increases from first ratio C1 to a second ratio C2. Transition layer 43 is formed on buffer layer 41 between second time point P2 and third time point P3. From third time point P3 to a fourth time point P4, the C/Si ratio is maintained at second ratio C2. Drift layer 42 is formed on transition layer 43 between third time point P3 and fourth time point P4.

From first time point P1 to fourth time point P4, the hydrogen flow rate is, for example, 134 slm. Between third time point P3 and fourth time point P4, the flow rate of silane is, for example, 140 sccm. For example, the C/Si ratio is adjusted by changing the flow rate of silane while keeping the flow rate of propane constant. First ratio C1 is, for example, 1.0. Second ratio C2 is, for example, 1.3. The temperature for forming drift layer 42 is higher than the temperature for forming buffer layer 41. The temperature for forming transition layer 43 is lower than the temperature for forming drift layer 42 and higher than the temperature for forming buffer layer 41.

Figure 13:
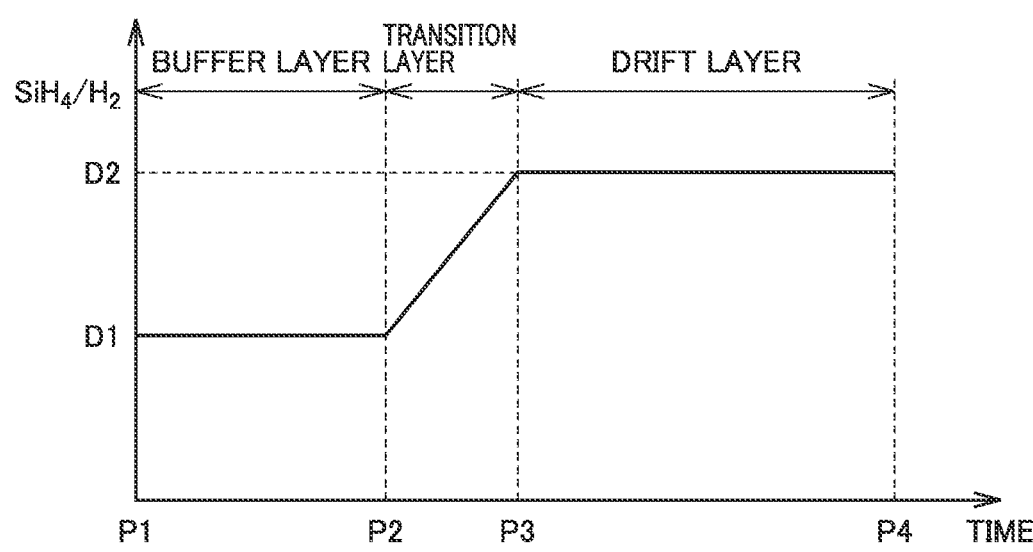
FIG. 13 is a diagram showing the relationship between $SiH_4/H_2$ and time.

FIG. 13 is a diagram showing the relationship between $SiH_4/H_2$ and time. $SiH_4/H_2$ is a value (dimensionless) obtained by dividing the flow rate of $SiH_4$ by the flow rate of $H_2$. As shown in FIG. 13, at first time point P1, $SiH_4/H_2$ is set to a third ratio D1. From first time point P1 to second time point P2, $SiH_4/H_2$ is maintained at third ratio D1. Buffer layer 41 is formed on silicon carbide substrate 30 between first time point P1 and second time point P2. $SiH_4/H_2$ monotonically increases from second time point P2 to third time point P3. From second time point P2 to third time point P3, $SiH_4/H_2$ increases from third ratio D1 to a fourth ratio D2. Transition layer 43 is formed on buffer layer 41 between second time point P2 and third time point P3. From third time point P3 to fourth time point P4, $SiH_4/H_2$ is maintained at fourth ratio D2. Drift layer 42 is formed on transition layer 43 between third time point P3 and fourth time point P4.

From first time point P1 to fourth time point P4, the hydrogen flow rate is, for example, 134 slm. Between third time point P3 and fourth time point P4, the flow rate of silane is, for example, 140 sccm. For example, the $SiH_4/H_2$ is adjusted by varying the silane flow rate while maintaining a constant hydrogen flow rate. Third ratio D1 is, for example, 0.00044. Fourth ratio D2 is, for example, 0.00104.

The time from second time point P2 to third time point P3 is, for example, 2.5 minutes. The amount of change in the C/Si ratio per unit time is, for example, 0.12/min. The amount of change in $SiH_4/H_2$ per unit time is, for example, 0.00024/min. Thus, silicon carbide epitaxial substrate 100 having silicon carbide substrate 30 and silicon carbide epitaxial layer 40 is prepared (see FIG. 2).

Silicon Carbide Semiconductor Device

Next, a configuration of a silicon carbide semiconductor device according to an embodiment of the present disclosure will be described.

Figure 14:
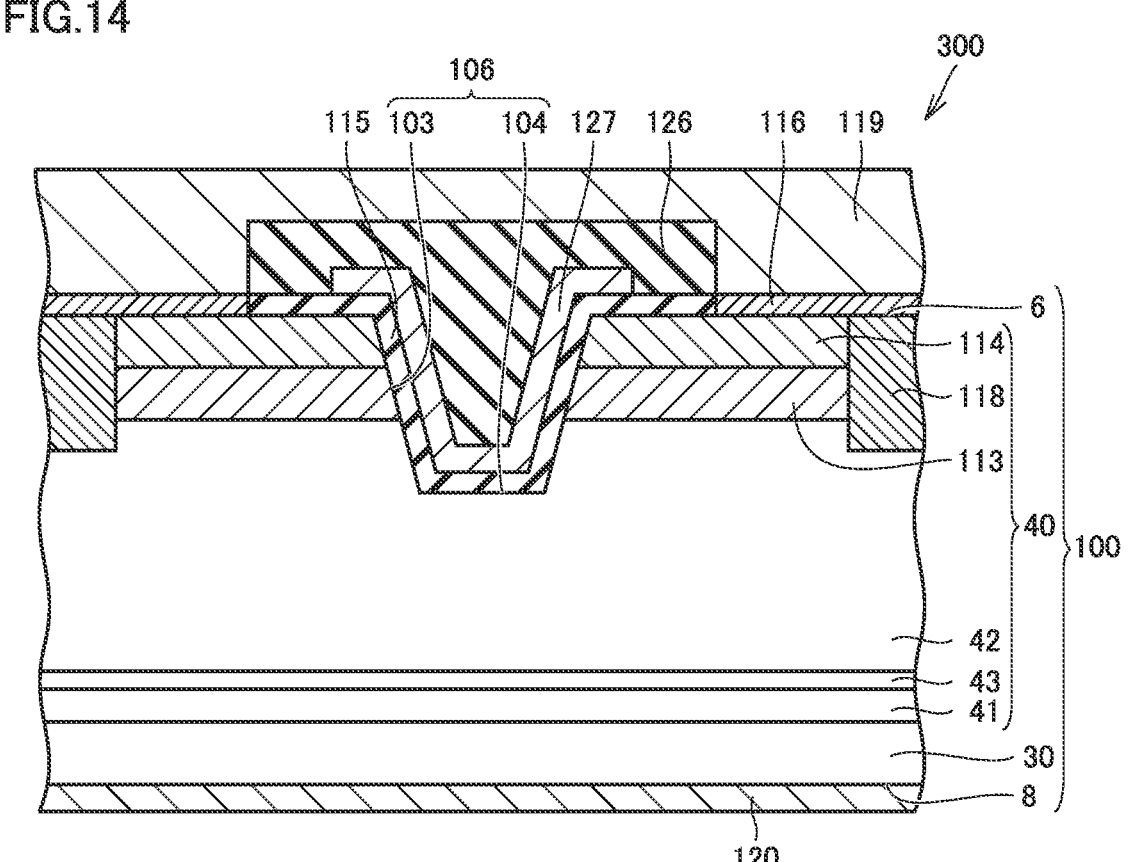
FIG. 14 is a schematic cross-sectional view showing a configuration of a silicon carbide semiconductor device according to an embodiment of the present disclosure.

FIG. 14 is a schematic cross-sectional view showing a configuration of a silicon carbide semiconductor device according to an embodiment of the present disclosure. As shown in FIG. 14, a silicon carbide semiconductor device 300 according to an embodiment of the present disclosure mainly includes silicon carbide epitaxial substrate 100, a gate insulating film 115, a gate electrode 127, a source electrode 116, a drain electrode 120, a source wire 119, and an interlayer insulating film 126. Silicon carbide epitaxial substrate 100 includes silicon carbide substrate 30, silicon carbide epitaxial layer 40, first main surface 6, and second main surface 8. Silicon carbide epitaxial layer 40 includes buffer layer 41, transition layer 43, drift layer 42, a body region 113, a source region 114, and a contact region 118.

Body region 113 is formed on drift layer 42. Body region 113 contains a p-type impurity such as aluminum. Body region 113 has a p-type conductivity. Source region 114 is formed on body region 113. Source region 114 contains an n-type impurity such as phosphorus. Source region 114 has n-type conductivity. A concentration of the n-type impurity contained in source region 114 may be higher than a concentration of the p-type impurity contained in body region 113.

Contact region 118 penetrates through source region 114 and body region 113. Contact region 118 is in contact with each of source region 114, body region 113, and drift layer 42. A concentration of the p-type impurity contained in contact region 118 may be higher than a concentration of the n-type impurity contained in source region 114.

A trench 106 is provided in first main surface 6. Trench 106 is defined by a side 103 and a bottom 104. Side 103 includes source region 114, body region 113, and drift layer 42. Bottom 104 is composed of drift layer 42.

Gate insulating film 115 contacts drift layer 42 at bottom 104, and contacts each of drift layer 42, body region 113, and source region 114 at side 103. Gate electrode 127 is disposed on gate insulating film 115. Gate electrode 127 contacts gate insulating film 115 in trench 106. Gate electrode 127 faces each of side 103 and bottom 104 of trench 106.

Interlayer insulating film 126 covers gate electrode 127. Interlayer insulating film 126 is in contact with gate insulating film 115. Interlayer insulating film 126 is made of a material containing silicon dioxide, for example. Source electrode 116 is in contact with each of source region 114 and contact region 118. Source electrode 116 is made of a material containing Ti, Al, and Si, for example. Source wire 119 is in contact with source electrode 116. Source wire 119 is electrically connected to source electrode 116. Source wire 119 covers source electrode 116 and interlayer insulating film 126. Drain electrode 120 is in contact with silicon carbide substrate 30.

Although silicon carbide semiconductor device 300 is a MOSFET in the above-described embodiment, silicon carbide semiconductor device 300 is not limited to the MOSFET. Silicon carbide semiconductor device 300 may be, for example, an IGBT (Insulated Gate Bipolar Transistor) or the like.

Next, operational effects of silicon carbide epitaxial substrate 100 according to the embodiment of the present disclosure will be described.

When silicon carbide epitaxial layer 40 is formed on silicon carbide substrate 30 by epitaxial growth, first defect 10 and second defect 20 may be formed in the main surface 6 of silicon carbide epitaxial substrate 100. Each of first defect 10 and second defect 20 is formed due to a screw dislocation present in silicon carbide substrate 30. First defect 10 is shaped to bifurcate from first origin 14 as viewed in a direction perpendicular to main surface 6. No recessed groove is present on imaginary line segment 16 connecting both ends of first defect 10. First defect 10 may be referred to as a carrot defect.

On the other hand, second defect 20 includes V-shaped defect 51 having a V shape and trapezoidal defect 52 having a trapezoidal shape as viewed in a direction perpendicular to main surface 6. V-shaped defect 51 is shaped to bifurcate from second origin 24. Recessed grooves are present in second base 26 of trapezoidal defect 52. Second defect 20 may be referred to as a defect that changes from a carrot defect to a triangular defect.

Based on the findings of the inventors, it has been confirmed that when a silicon carbide semiconductor device is manufactured using silicon carbide epitaxial substrate 100 including second defect 20, the probability that the silicon carbide semiconductor device does not operate normally is high. On the other hand, it has been confirmed that in the case where a silicon carbide semiconductor device is fabricated using silicon carbide epitaxial substrate 100 including first defect 10, the probability that the silicon carbide semiconductor device does not operate normally is significantly lower than in the case where the silicon carbide semiconductor device includes the second defect. Therefore, in order to improve the yield of the silicon carbide semiconductor device, it is desirable to reduce second defect 20.

As a result of intensive studies on measures for reducing second defect 20, the inventors have obtained the following findings and found silicon carbide epitaxial substrate 100 according to an embodiment of the present disclosure. Specifically, when buffer layer 41 is formed on silicon carbide substrate 30, a threading dislocation existing in silicon carbide substrate 30 may be converted into a basal plane dislocation in buffer layer 41 (see FIGS. 4 and 7). When transition layer 43 is formed on buffer layer 41, if the growth condition of transition layer 43 deviates from the optimum condition, V-shaped defect 51 is changed into trapezoidal defect 52. As a result, second defect 20 including V-shaped defect 51 and trapezoidal defect 52 is formed in first main surface 6 of silicon carbide epitaxial substrate 100 (see FIG. 6). On the other hand, when transition layer 43 is formed on buffer layer 41, if the growth condition of transition layer 43 is controlled to an optimum condition, the V-shaped defects are not changed into trapezoidal defects 52 and grow to the end as the V-shaped defects. As a result, first defect 10 is formed in first main surface 6 of silicon carbide epitaxial substrate 100.

As a result of intensive studies, the inventors have found that the area density of first defects 10 can be increased and the area density of second defects 20 can be reduced in first main surface 6 of silicon carbide epitaxial substrate 100 by setting the C/Si ratio to about 0.12/min and the amount of change in the $SiH_4/H_2$ ratio to about 0.00024/min during the growth of transition layer 43. In particular, according to silicon carbide epitaxial substrate 100 of the present disclosure, the first area density is 0.03 particles/cm$^2$ or more, and the value obtained by dividing the second area density by the sum of the first area density and the second area density is less than 2.91%. Thus, the yield of the silicon carbide semiconductor device can be improved.

EXAMPLES

Sample Preparation

First, silicon carbide epitaxial substrates 100 according to Samples 1 to 33 were prepared. Silicon carbide epitaxial substrates 100 according to samples 1 to 29 are examples. The silicon carbide epitaxial substrates of samples 30 to 33 are comparative examples.

Silicon carbide epitaxial substrates 100 according to samples 1 to 29 were manufactured according to the method described in FIGS. 12 and 13. From first time point P1 to fourth time point P4, the flow rate of hydrogen gas was set to 134 slm. From third time point P3 to fourth time point P4, the flow rate of silane was set to 140 sccm. First ratio C1 was set to 1.0. Second ratio C2 was set to 1.3. Third ratio D1 was set to 0.00044. Fourth ratio D2 was set to 0.00104. The time from second time point P2 to third time point P3 was 2.5 minutes. The amount of change in the C/Si ratio per unit time is 0.12/min. The amount of change in $SiH_4/H_2$ per unit time is 0.00024/min.

Silicon carbide epitaxial substrates 100 according to the samples 30 to 33 were manufactured as follows. From first time point P1 to fourth time point P4, the flow rate of hydrogen gas was set to 134 slm. From third time point P3 to fourth time point P4, the flow rate of silane was set to 140 sccm. First ratio C1 was set to 0.8. Second ratio C2 was set to 1.3. Third ratio D1 was set to 0.00035. Fourth ratio D2 was set to 0.00104. The time from second time point P2 to third time point P3 was 1.5 minutes. The amount of change in the C/Si ratio per unit time is 0.33/min. The amount of change in $SiH_4/H_2$ per unit time is 0.00046/min.

Experimental Method

A defect inspection apparatus (WASAVI series "SICA 6X") manufactured by Lasertec corporation was used to measure the area density of each of first defects 10 and second defects 20 in first main surface 6 of silicon carbide epitaxial substrate 100 according to the samples 1 to 33. Based on the area density of first defect 10 and the area density of second defect 20, a value was calculated by dividing the area density of second defect 20 by the sum of the area density of first defect 10 and the area density of second defect 20. The magnification of the objective lens of the defect inspection apparatus was 10 times. A mercury xenon lamp was used as a light source. The entire surface of first main surface 6 was irradiated with light having a wave length of 546 nm. The reflected light was observed by a light receiving element.

Experimental Results

TABLE 1

| Sample No. | (1) Area Density of First Defect (/cm$^2$) | (2) Area Density of Second Defect (/cm$^2$) | (2)/((1) + (2)) |
|---|---|---|---|
| Sample 1 | 0.38 | 0 | 0.00% |
| Sample 2 | 0.80 | 0 | 0.00% |
| Sample 3 | 0.22 | 0 | 0.00% |
| Sample 4 | 0.36 | 0 | 0.00% |
| Sample 5 | 0.72 | 0 | 0.00% |
| Sample 6 | 0.54 | 0 | 0.00% |
| Sample 7 | 0.73 | 0 | 0.00% |
| Sample 8 | 0.17 | 0 | 0.00% |
| Sample 9 | 0.25 | 0 | 0.00% |
| Sample 10 | 0.36 | 0 | 0.00% |
| Sample 11 | 0.54 | 0 | 0.00% |
| Sample 12 | 0.12 | 0 | 0.00% |
| Sample 13 | 0.76 | 0 | 0.00% |
| Sample 14 | 0.11 | 0 | 0.00% |
| Sample 15 | 0.66 | 0 | 0.00% |
| Sample 16 | 0.17 | 0 | 0.00% |
| Sample 17 | 0.22 | 0 | 0.00% |
| Sample 18 | 0.21 | 0 | 0.00% |
| Sample 19 | 0.10 | 0 | 0.00% |
| Sample 20 | 0.49 | 0 | 0.00% |
| Sample 21 | 0.05 | 0 | 0.00% |
| Sample 22 | 0.28 | 0 | 0.00% |
| Sample 23 | 0.18 | 0 | 0.00% |
| Sample 24 | 0.62 | 0.006 | 0.96% |
| Sample 25 | 0.09 | 0 | 0.00% |
| Sample 26 | 0.22 | 0 | 0.00% |
| Sample 27 | 0.09 | 0 | 0.00% |
| Sample 28 | 0.34 | 0 | 0.00% |
| Sample 29 | 0.30 | 0.006 | 1.96% |

Table 1 shows the area density of first defect 10, the area density of second defect 20, and the value obtained by dividing the area density of second defect 20 by the sum of the area density of first defect 10 and the area density of second defect 20 in first main surface 6 of silicon carbide epitaxial substrate 100 of the example. As shown in Table 1, the area density of first defects 10 was 0.05 (/cm$^2$) to 0.80 (/cm$^2$). The area density of second defects 20 was 0 (/cm$^2$) to 0.006 (/cm$^2$). A value obtained by dividing the area density of second defect 20 by the sum of the area density of first defect 10 and the area density of second defect 20 was 0.00% to 1.96%.

TABLE 2

| Sample No. | (1) Area Density of First Defect (/cm²) | (2) Area Density of Second Defect (/cm²) | (2)/((1) + (2)) |
|---|---|---|---|
| Sample 30 | 0.82 | 0.02 | 2.91% |
| Sample 31 | 0.91 | 0.07 | 6.92% |
| Sample 32 | 0.28 | 0.06 | 16.49% |
| Sample 33 | 0.67 | 0.10 | 12.81% |

Table 2 shows an area density of first defect 10, an area density of second defect 20, and a value obtained by dividing the area density of second defect 20 by a sum of the area density of first defect 10 and the area density of second defect 20 in first main surface 6 of silicon carbide epitaxial substrate 100 of the comparative example. As shown in Table 2, the area density of first defects 10 was 0.28 (/cm²) to 0.91 (/cm²). The area density of second defects 20 was 0.02 (/cm²) to 0.10 (/cm²). A value obtained by dividing the area density of second defect 20 by the sum of the area density of first defect 10 and the area density of second defect 20 was 2.91% to 12.81%.

It is to be understood that the embodiments and examples disclosed herein are illustrative in all respects and are not restrictive. The scope of the present invention is defined not by the above-described embodiments and examples but by the claims, and is intended to include meanings equivalent to the claims and all modifications within the scope.

REFERENCE SIGNS LIST

1 first basal plane dislocation, 2 second basal plane dislocation, 3 orientation flat, 4 arc-shaped portion, 5 outer peripheral edge, 6 first main surface, 7 boundary surface, 8 second main surface, 9 third main surface, 10 first defect, 11 first straight portion, 12 second straight portion, 13 boundary, 14 first origin, 15 first end portion, 16 imaginary line segment, 20 second defect, 21 third straight portion, 22 fourth straight portion, 23 first base, 24 second origin, 26 second base, 30 silicon carbide substrate, 40 silicon carbide epitaxial layer, 41 buffer layer, 42 drift layer, 43 transition layer, 51 V-shaped defect, 52 trapezoidal defect, 53 recessed groove, 100 silicon carbide epitaxial substrate, 101 first direction, 102 second direction, 103 side, 104 bottom, 106 trench, 110 screw dislocation, 111 first screw dislocation, 112 second screw dislocation, 113 body region, 114 source region, 115 gate insulating film, 116 source electrode, 118 contact region, 119 source wire, 120 drain electrode, 126 interlayer insulating film, 127 gate electrode, 200 photoluminescence imaging apparatus, 220 excitation light generation unit, 221 light source, 222 light guide, 223 filter, 230 imaging unit, 231 controller, 232 stage, 233 near-infrared objective lens, 235 color image sensor, 300 silicon carbide semiconductor device, A1 first length, A2 second length, A3 third length, A4 fourth length, A5 fifth length, A6 sixth length, B1 first width, B2 second width, C1 first ratio, C2 second ratio, D1 third ratio, D2 fourth ratio, L1 first straight line, L2 second straight line, LE excitation light, LL photoluminescence light, P1 first time point, P2 second time point, P3 third time point, P4 fourth time point, S1 first region, S2 second region, S3 third region, S4 fourth region, S5 fifth region, T1 first thickness, T2 second thickness, T3 third thickness, W1 maximum diameter

The invention claimed is:

1. A silicon carbide epitaxial substrate comprising:

a silicon carbide substrate including a plurality of screw dislocations; and a silicon carbide epitaxial layer being on the silicon carbide substrate, wherein the silicon carbide epitaxial layer includes a buffer layer in contact with the silicon carbide substrate, a transition layer being on the buffer layer, and a drift layer being on the transition layer, the drift layer has a boundary surface in contact with the transition layer and a main surface opposite to the boundary surface, when a defect due to a first screw dislocation among the plurality of screw dislocations is a first defect, a defect due to a second screw dislocation among the plurality of screw dislocations is a second defect, an area density of the first defect is a first area density, and an area density of the second defect is a second area density, the first area density is 0.03/cm² or more, and a value obtained by dividing the second area density by a sum of the first area density and the second area density is less than 2.91%, the first defect, as viewed perpendicularly to the main surface, is shaped to bifurcate from a first origin, and no recessed groove is present on an imaginary line segment connecting both ends of the first defect, and the second defect, as viewed perpendicularly to the main surface, includes a V-shaped defect bifurcating from a second origin and a trapezoidal defect contiguous to the V-shaped defect and having a trapezoidal shape, the trapezoidal defect has a first base contiguous to both ends of the V-shaped defect and a second base opposite to the first base, and a recessed groove is present at the second base.

2. The silicon carbide epitaxial substrate according to claim 1, wherein the V-shaped defect and the trapezoidal defect each include a stacking fault.

3. The silicon carbide epitaxial substrate according to claim 1, wherein the silicon carbide substrate and the silicon carbide epitaxial layer are each formed of 4H polytype silicon carbide, and the trapezoidal defect includes 3C polytype silicon carbide.

4. The silicon carbide epitaxial substrate according to claim 1, wherein the first area density is 1/cm² or less.

5. The silicon carbide epitaxial substrate according to claim 1, wherein the buffer layer has a thickness of 1 μm or more.

6. The silicon carbide epitaxial substrate according to claim 1, wherein when photoluminescence light generated from the first defect upon irradiation of the first defect with excitation light is expressed in RGB color space, R is 147 to 187, G is 137 to 162, and B is 224 to 254.

7. The silicon carbide epitaxial substrate according to claim 1, wherein when photoluminescence light generated from the V-shaped defect upon irradiation of the V-shaped defect with excitation light is expressed in RGB color space, R is 147 to 187, G is 137 to 162, and B is 224 to 254.

8. The silicon carbide epitaxial substrate according to claim 1, wherein when photoluminescence light generated from the trapezoidal defect upon irradiation of the trapezoidal defect with excitation light is expressed in RGB color space, R is 56 to 115, G is 71 to 128, and B is 56 to 123.

9. The silicon carbide epitaxial substrate according to claim 1, wherein the value obtained by dividing the second area density by the sum of the first area density and the second area density is 2% or less.

10. A silicon carbide semiconductor device comprising the silicon carbide epitaxial substrate according to claim 1.

\* \* \* \* \*